United States Patent
Sundaram et al.

(10) Patent No.: US 6,376,991 B1
(45) Date of Patent: Apr. 23, 2002

(54) CIRCUIT ASSEMBLY FOR INCLUSION WITHIN FLUORESCENT LAMP

(75) Inventors: Sridhar Sundaram, Austin, TX (US); Juan Sabate, Saratoga Springs; Jose Azevedo, Mahopac, both of NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/757,876

(22) Filed: Jan. 10, 2001

(51) Int. Cl.$^7$ ................................................ H01J 13/46
(52) U.S. Cl. ........................... 315/58; 315/56; 362/221; 362/260
(58) Field of Search .............................. 315/56, 58, 73; 362/217, 221, 224, 226, 260, 373; 313/493, 33

(56) References Cited

U.S. PATENT DOCUMENTS

| | | | |
|---|---|---|---|
| 4,503,360 A | * 3/1985 | Bedel | 313/19 |
| 4,869,744 A | 9/1989 | Romberg | 65/105 |
| 4,926,092 A | 5/1990 | Gibson et al. | 313/493 |
| 5,004,949 A | 4/1991 | Latassa et al. | 313/492 |
| 5,030,889 A | * 7/1991 | El-Hamamsy et al. | 315/200 R |
| 5,117,156 A | 5/1992 | Leyh et al. | 315/73 |
| 5,485,057 A | 1/1996 | Smallwood et al. | 315/58 |
| 5,654,609 A | * 8/1997 | Smallwood et al. | 315/50 |
| 5,703,440 A | * 12/1997 | Kachmarik et al. | 315/56 |
| 6,052,300 A | 4/2000 | Bishop et al. | 363/131 |

OTHER PUBLICATIONS

U.S. Patent Application for "Electronic Ballast with Feed–Forward Control", U.S. Ser. No. 09/730,430, Filed Dec. 5, 2000 by Juan Sabate.

\* cited by examiner

Primary Examiner—Haissa Philogene

(57) ABSTRACT

A compact circuit assembly is provided for containment within the end of a circular fluorescent lamp envelope. The circuit assembly includes a plurality of circular circuit boards arranged along the length of the envelope end and having respective peripheries contacting an inner surface of the envelope. The circuit boards are interconnected and held in spaced-apart positions by a plurality of longitudinally-extending conductors which also serve as electrical buses for making electrical connections.

12 Claims, 2 Drawing Sheets

CIRCUIT ASSEMBLY FOR INCLUSION WITHIN FLUORESCENT LAMP

BACKGROUND OF THE INVENTION

1. Field of the Invention

This invention relates to fluorescent lamps and, in particular, to the attachment of power circuitry to such lamps.

2. Description of Related Art

It is well known in the art to electrically connect fluorescent lamps to primary power sources via a variety of different types of power circuitry. For example, complex ballast circuits are commonly provided to perform a number of power-related functions including, inter alia, the conversion of power from the primary sources to AC voltages and frequencies corresponding to the requirements of respective lamps and the limiting and control of the flow of electrical current to the lamps. In recent years, electronic ballasts have been invented which are substantially smaller than their magnetic ballast precursors while even having the capabilities of performing additional functions, e.g. dimming. If the operating frequency is increased, the size of magnetic and filter components of an electronic ballast can be further decreased. As a consequence of increasing the frequency, however, electrical losses tend to increase, particularly because of losses in the impedances of long leads typically used to connect ballasts to lamps. More specifically, the leads have inductive impedances with voltage drops that increase with frequency and parasitic capacitances which bypass current intended for the lamp.

Traditionally, power circuits for fluorescent lamps are incorporated in fixtures for the lamps. This is done primarily because of size, weight, cost and safety factors of such circuits and, especially, in relationship to complex and relatively-heavy ballast circuits. However, if the power circuits can be operationally and cost effectively incorporated in the lamps, rather than in the fixtures, there are many advantages. To name a few:

- Each fixture will no longer be limited to use with specific lamp types which are associated with a specific power circuitry installed in the fixture.
- It will be impossible for the user to install the wrong lamp in the fixture.
- The power circuit and lamp can be optimized to work together to maximize efficiency and lamp life, while minimizing circuit volume and parts count.
- Fixtures can be less expensive, more attractive, and have more efficient reflector designs, because they will no longer need to be designed around the power circuitry.
- The need for long connection leads will be eliminated, thereby enabling an increase in operating frequency without the consequent increases in electrical losses.
- High-voltage power circuitry can be contained within the lamp envelope, thereby reducing shock hazards.

While the prior art, e.g. U.S. Pat. No. 5,485,057, describes miniaturized power circuitry for fitting within the envelope of a lamp, further development is needed to achieve effective containment of the circuitry within the envelope. Such circuitry should be compact while still allowing for effective heat dissipation and facilitating electrical connections to a primary power source and to the lamp itself.

SUMMARY OF THE INVENTION

It is an object of the invention to provide a compact structure for supporting power circuitry within a lamp envelope.

It is another object of the invention to provide such a structure which readily adapts to design changes in the power circuitry affecting the number and/or sizes of the circuit components.

It is yet another object of the invention to provide such a structure which facilitates the making of electrical connections to the circuit components and to terminals and electrodes of the lamp itself.

In accordance with the invention a circuit assembly for containment within a longitudinally-extending tubular envelope portion of a fluorescent lamp is provided which includes first and second spaced-apart circuit boards arranged along the longitudinal direction of the envelope portion. Each of the first and second circuit boards has a side extending transversely of the longitudinal direction for supporting at least one circuit component and has a periphery shaped and dimensioned to substantially conform with a circumferential inner surface of the tubular envelope portion. A plurality of longitudinally-extending support members are coupled to the first and second circuit boards for positioning the circuit boards relative to each other. In a preferred form of the invention, the support members comprise electrical conductors which are used for both holding the boards in position and providing electrical connections between the boards.

The size of the circuit assembly is determined by the cross-sectional area of the envelope and by the total area needed to mount circuit components. There need be no wasted space. The circuit assembly is readily adaptable to changes in circuit components by merely increasing or decreasing the number of circuit boards and/or the spacing between the circuit boards.

Further, no additional parts need be provided for supporting the circuit assembly within the envelope. The circuit boards and the conductors perform both structural and electrical functions.

DESCRIPTION OF THE PREFERRED EMBODIMENTS

Figure 1:
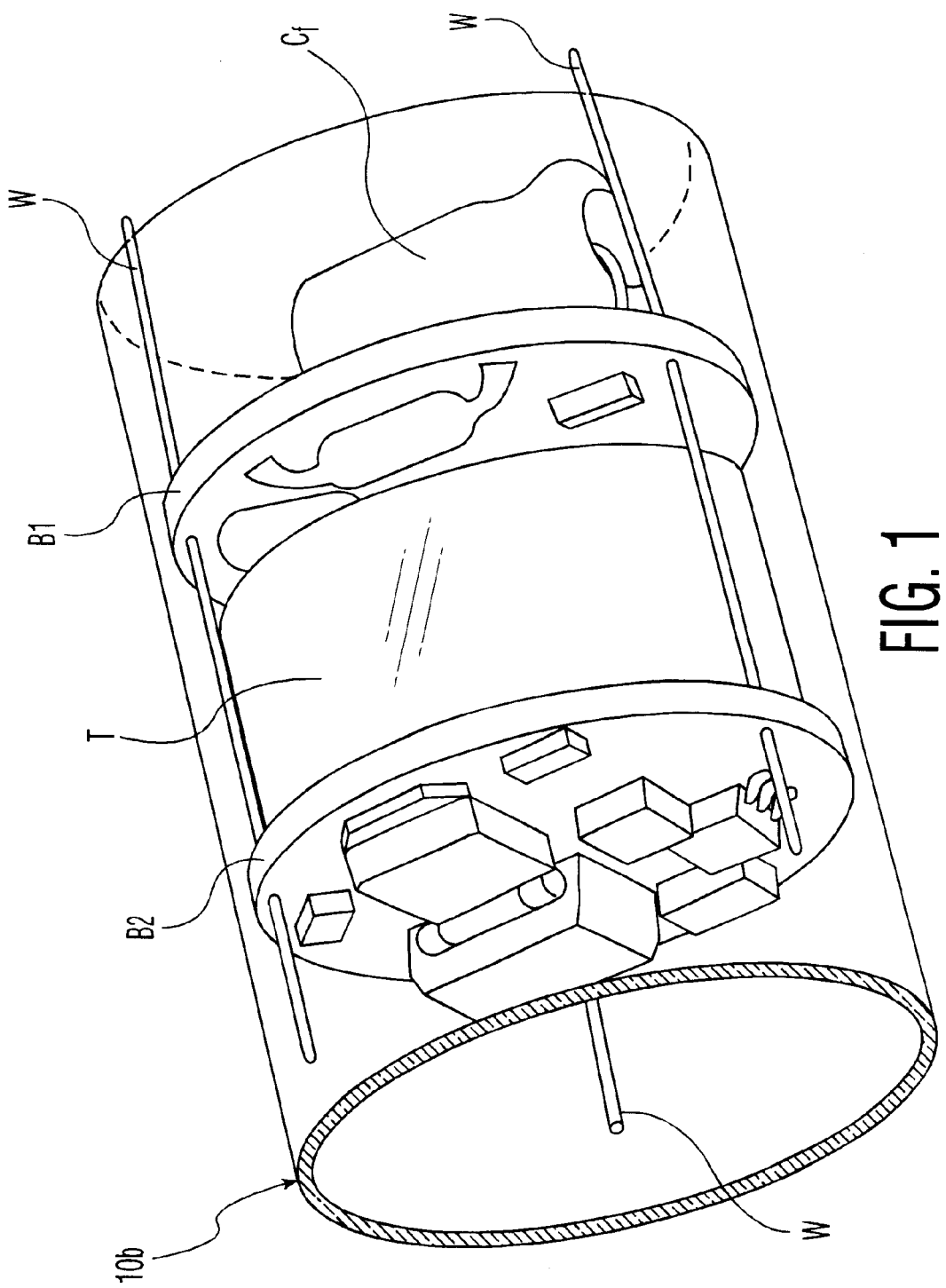
FIG. 1 is a three-dimensional illustration of an embodiment of a circuit assembly in accordance with the invention.

FIG. 1 illustrates a model of an exemplary embodiment of an electronic ballast circuit assembly in accordance with the invention. The circuit assembly is slidably mounted within a circular glass envelope portion 10b of a fluorescent lamp (not shown). The circuit assembly includes spaced-apart circuit boards B1 and B2 and a plurality of conductors W, each passing through respective apertures in the two circuit boards.

Each of the circuit boards has a circular periphery which conforms with the circular inner surface of the envelope portion 10b and is dimensioned to be freely slidable. Circuit board B1 supports representative components (e.g. a diode bridge, EMI filter components and a filter capacitor $C_f$) for converting AC line voltage (e.g. 120 VAC@ 60 Hz) to a DC voltage. Circuit board B2 supports representative components (e.g. transistor switches, control circuitry and a resonant tank T enclosed within a plastic housing) for converting the DC voltage to a high frequency AC voltage for starting and powering the fluorescent lamp.

A compact electronic ballast circuit has been specifically developed and tested for incorporation in a circuit assembly of the type shown in FIG. 1. That circuit is disclosed in a U.S. patent application Ser. No. 09/730,430 filed on Dec. 5, 2000 which is hereby incorporated by reference.

Another example of a compact electronic ballast circuit which may be incorporated in a circuit assembly in accordance with the invention is described in U.S. Pat. No. 6,072,710.

Preferably, electrical connections between the components on the circuit boards are made by conductive tracks (not shown) on the boards themselves. Typically, as is well known in the art, these conductive tracks (not shown) are on either or both sides or even within (e.g. multi-layer boards) the boards themselves.

The conductors W serve to both maintain the circuit boards B1 and B2 in a spaced-apart relationship and to operate as buses for making electrical connections between the boards on a selective basis. The spacing between the circuit boards in the assembly is readily adjusted during assembly to facilitate thermal management and to prevent unwanted electrical contact between the components on the respective boards. Preferably, the spacing between the boards and the positions of components on the boards is designed to effect substantial uniformity of temperature distribution during operation. Electrical connections are conveniently made by soldering the conductors to conductive pads or tracks on the boards which surround the apertures through which the conductors pass. Alternatively, such electrical connections may be made by use of a conductive adhesive. If any of the conductors W is to be attached to a board in an electrically insulating manner, this may be done, for example, by soldering the respective conductor to a conductive pad on the board which is electrically isolated from the other conductors on the board or by adhesively connecting it to an electrically insulating part of the board.

Note that in the embodiment of FIG. 1 three conductors W are disposed symmetrically around the periphery of the circuit boards at angular separations of about 120°. Although this is one preferred arrangement, the actual number and placement of these conductors is readily adapted to facilitate electrical connections to the specific circuitry on the boards and to permit freedom of locating the circuit components on the boards.

Figure 2:
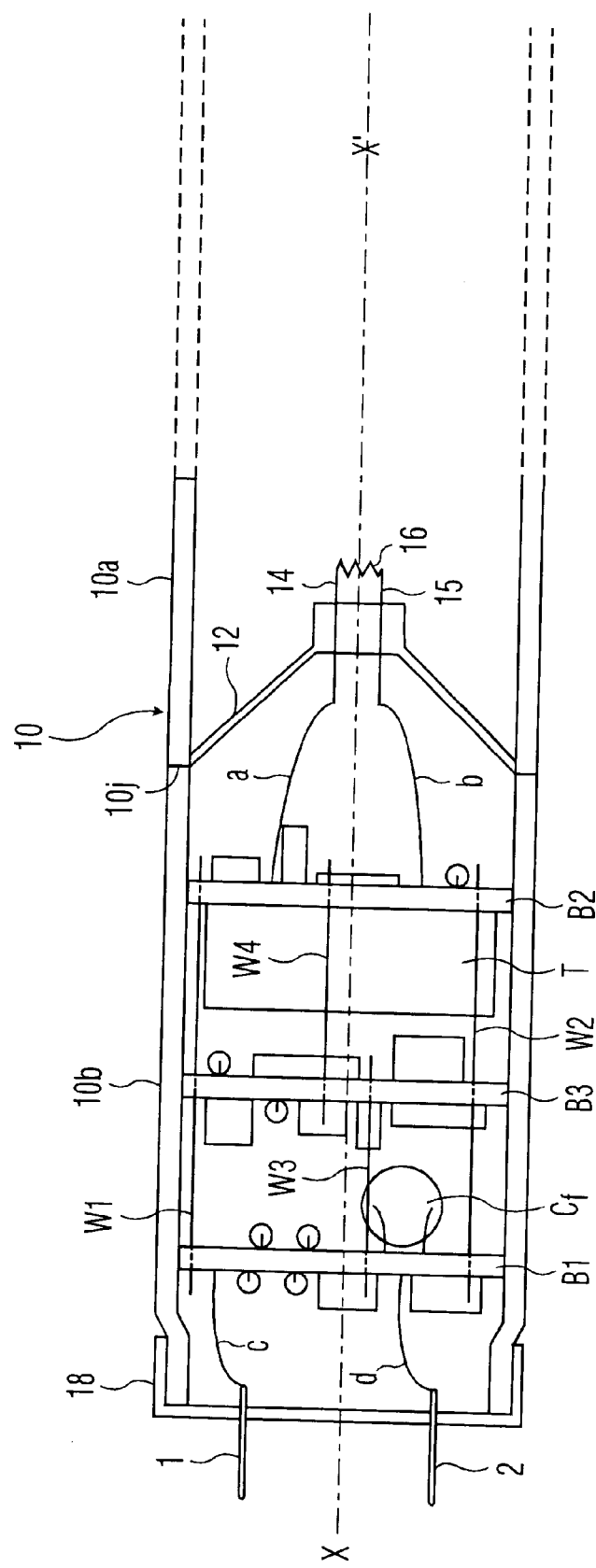
FIG. 2 is a front view of an embodiment of a circuit assembly in accordance with the invention that has been incorporated within a fluorescent lamp.

FIG. 2 illustrates one end of a fluorescent lamp in which another embodiment of a circuit assembly having three circuit boards B1, B2 and B3 and four interconnecting conductors W1–W4 has been incorporated. Specifically, FIG. 2 shows one end of a lamp which includes a glass tubular envelope 10 having a sealed light-emissive portion 10a and a power-circuit portion 10b. The light-emissive portion, of which only a small part is shown, contains an ionizable gaseous medium and has a fluorescent coating on an inner surface of the envelope. The end of the light-emissive portion is sealed by a first stem 12 through which conductive feedthroughs 14 and 15 pass. The feedthroughs provide electrical connections and mechanical support for a first electrode 16. Such stems and their sealing to lamp envelopes are described in, for example, U.S. Pat. Nos. 5,117,156, 4,869,744, 5,004,949 and 4,926,092, which are hereby incorporated by reference. The opposite end (not shown) of the light-emissive portion 10a is advantageously sealed by a second stem, similar to stem 12, for supporting a second electrode. As is well known in the art, the fluorescent material emits light radiation in response to the ionization of the gaseous molecules by an electrical discharge between the first and second electrodes.

The power-circuit portion 10b is an integral part of the tubular lamp envelope. In the embodiment shown, one end of this portion is attached to the light-emissive portion 10a at a junction 10j by heating and fusing the two portions together. In an alternative embodiment (not shown) portions 10a and 10b are integral parts of a single tubular envelope. The demarcation between the two portions is defined by recessing the stem 12 within one end of the single envelope and sealing the rim of the stem to the inner surface of the envelope.

An opposite end of the tubular envelope portion 10b. is constricted to form a collar for receiving an end cap 18. This can be done by a method such as is taught in U.S. Pat. No. 4,869,744. In the embodiment shown in FIG. 2, the end cap is formed of a conductive material (such as aluminum) from which the through pins are electrically insulated by means of surrounding rings (not shown) of glass or ceramic or other insulating material, as is known in the art. The pins may have a variety of cross-sectional shapes and positions, to correspond with the mating lamp sockets in the respective fixtures with which the lamps are intended to be used.

The circuit assembly is disposed within the portion 10b and, in this exemplary embodiment:

circuit board B1 is electrically connected to pins 1 and 2 by conductors c and d, respectively;

circuit board B2 is electrically connected to the leadthroughs 14 and 15 by conductors a and b, respectively; and conductors W1 and W2 are utilized to physically connect all three circuit boards, conductor W3 is used to physically connect only boards B1 and B3, and conductor W4 is used to physically connect only boards B2 and B3.

In this embodiment, the third circuit board B3 has been added to provide space for additional or larger circuit components. Additionally, four interconnecting conductors W1–W4 are provided to increase the number of different bus connections that are possible. The conductors W3 and W4 physically replace one of the three conductors W that are used in the embodiment of FIG. 1.

FIGS. 1 and 2 demonstrate the adaptability of a circuit assembly in accordance with the invention. Many other alternative arrangements for the numbers, positions and physical and electrical connections are possible for the boards and the interconnecting conductors W. Further, FIG. 2 illustrates only one of many possible ways of connecting the circuit assembly to lamp terminals and electrodes. Some additional examples can be found in a U.S. patent application Ser. No. 09/736,013 filed on Dec. 13, 2000, which is hereby incorporated by reference.

What is claimed is:

1. A circuit assembly for containment within a longitudinally tubular envelope portion of a fluorescent lamp, said circuit assembly comprising:

a. first and second spaced-apart circuit boards arranged along the longitudinal direction, each of said first and second circuit boards:

i) having a side extending transversely of the longitudinal direction for supporting at least one circuit component;

ii) having a periphery shaped and dimensioned to substantially conform with a circumferential inner surface of the tubular envelope portion;

b. a plurality of longitudinally-extending support members coupled to the first and second circuit boards for positioning said circuit boards relative to each other.

2. A circuit assembly as in claim 1 where the circuit boards support electrically-connected circuit components forming circuitry for powering the fluorescent lamp.

3. A circuit assembly as in claim 2 where the circuitry comprises an electronic ballast.

4. A circuit assembly as in claim 1 where at least one of the longitudinally-extending support members comprises an electrical conductor for electrically connecting the first and second circuit boards.

5. A circuit assembly as in claim 1 where the longitudinally-extending support members are attached to the peripheries of the circuit boards.

6. A circuit assembly as in claim 5 where the longitudinally-extending support members are substantially uniformly angularly spaced around the peripheries of the circuit boards.

7. A circuit assembly as in claim 1 including a third circuit board spaced apart from the first and second circuit boards along the longitudinal direction and coupled to at least one of the plurality of longitudinally-extending support members.

8. A compact circuit assembly for containment within an end of a circular fluorescent lamp envelope, said circuit assembly including a plurality of circular circuit boards arranged along the length of the envelope end and having respective peripheries in sliding contact with an inner surface of the envelope, said circuit boards being interconnected and held in spaced-apart positions by a plurality of longitudinally-extending conductors which also serve as electrical buses for making electrical connections.

9. A compact circuit assembly as in claim 8 where the circuit boards support electrically-connected circuit components forming circuitry for powering the fluorescent lamp.

10. A compact circuit assembly as in claim 9 where the circuitry comprises an electronic ballast.

11. A compact circuit assembly as in claim 8 where the longitudinally-extending conductors are attached to the peripheries of the circuit boards.

12. A compact circuit assembly as in claim 10 where the longitudinally-extending conductors are substantially uniformly angularly spaced around the peripheries of the circuit boards.

* * * * *